United States Patent [19]
Abe et al.

[11] Patent Number: 5,646,442
[45] Date of Patent: Jul. 8, 1997

[54] CONTACT STRUCTURE FOR IC SOCKET

[75] Inventors: Shunji Abe, Yokohama; Kazumi Uratsuji, Tokyo, both of Japan

[73] Assignee: Yamaichi Electronics Co., Ltd., Tokyo, Japan

[21] Appl. No.: 528,150

[22] Filed: Sep. 14, 1995

[30] Foreign Application Priority Data

Sep. 16, 1994 [JP] Japan ................... 6-248431

[51] Int. Cl.$^6$ ........................... H01L 23/48
[52] U.S. Cl. ............ 257/697; 257/727; 257/778
[58] Field of Search ................. 257/727, 778, 257/726, 697

[56] References Cited

U.S. PATENT DOCUMENTS

| | | | |
|---|---|---|---|
| 2,958,064 | 10/1960 | Swengel | 339/17 |
| 5,164,818 | 11/1992 | Blum et al. | 257/778 |

FOREIGN PATENT DOCUMENTS

| | | | |
|---|---|---|---|
| 4-72659 | 3/1992 | Japan | 257/778 |
| 6-61405 | 3/1994 | Japan | 257/727 |

*Primary Examiner*—Sara W. Crane
*Assistant Examiner*—Roy Potter
*Attorney, Agent, or Firm*—Wenderoth, Lind & Ponack

[57] ABSTRACT

A contact structure for an IC socket is usable for an IC package having a number of spherical type terminals or a number of cylindrical terminals arranged on the lower surface of an IC main body. To realize this contact structure for an IC socket, a number of contacts arranged corresponding to the spherical type terminals or the cylindrical terminals on the IC main body are provided. Resilient contact pieces for allowing each contact to come into pressure contact with each terminal at one point or at two points on the peripheral surface of the respective terminals are provided. Plural groups are constructed for a group of contacts and a group of terminals for changing an orientation of each resilient contact piece for allowing the group of contacts to give pressure contact force to the group of terminals in three directions or four directions. Each of the plural groups is arranged to generate an opposing force between adjacent groups.

9 Claims, 6 Drawing Sheets

CONTACT STRUCTURE FOR IC SOCKET

BACKGROUND OF THE INVENTION

1. Field of the Invention

The present invention relates to a contact structure of a BGA type IC package or a PGA type IC package with an IC socket.

2. Brief Description of the Prior Art

Referring to FIG. 1A to FIG. 1C, a BGA type IC package includes a number of semispherical terminals 2 below an IC package main body 1 as shown in FIG. 1A or it includes a number of spherical terminals 2 below an IC package main body 1 as shown in FIG. 1B. In addition, a PGA type IC package includes a number of cylindrical terminal 2 which are projected from the lower surface of an IC package main body 1 as shown in FIG. 2A and FIG. 2B.

Conventionally, the contact structures employed for the BGA type IC package or the PGA type IC socket have included a contact structure for allowing a resilient contact piece of a contact to come in pressure contact with one side surface of a spherical surface of the spherical type or cylindrical type terminal 2 and a contact structure for holding the spherical type or cylindrical type terminal 2 with a pair of resilient contact pieces in the clamped state so as to allow the resilient contact piece to come in pressure contact with the opposing two side surfaces.

There is a tendency toward terminals 2 being arranged at a shorter pitch and the contact area being increasingly restricted. Also, the aforementioned contact structure assures that the position of the terminal is restricted in the direction in which the resilient contact piece comes into pressure contact, but the position of the terminal is not restricted in other directions. Accordingly, there appears a problem that the positions of the terminals may deviate in such other directions with the result that it is difficult to correctly maintain the contacted state. Thus, it is difficult to cope with the tendency toward terminals being arranged with a shorter pitch.

As means for preventing the foregoing positional deviation, there is practiced a method of bringing a resilient contact piece into pressure contact with a terminal while the terminal is surrounded by the resilient contact piece at three or more points. This method can solve the problem of positional deviation but in consideration of the background that spherical type terminals and cylindrical type terminals are currently arranged at a very small pitch of 1.27 mm or less, it becomes very difficult from the viewpoint of the required space to dispose three or more resilient contact pieces around each terminal. Moreover, it becomes difficult to precisely work the resilient contact piece itself.

SUMMARY OF THE INVENTION

The present invention has been made in consideration of the aforementioned background.

An object of the present invention is to provide a contact structure for an IC socket which assures that deviation of each terminal in all directions can be reliably prevented, and moreover, assures that a relative contact position between each contact and each terminal can be properly maintained.

The present invention provides a contact structure of an IC socket usable for an IC package having a number of spherical type terminals or a number of cylindrical terminals (i.e. terminals with circular cross sections) arranged on the lower surface of an IC main body, wherein the contact structure is characterized in that a number of contacts arranged corresponding to the spherical type terminals or the cylindrical terminals on the IC main body are provided, resilient contact pieces for allowing each contact to come in pressure contact with each terminal at one point or at two points on the peripheral surface of the terminal are provided, and plural groups are constructed for a group of contacts and a group of terminals for changing an orientation of each resilient contact piece for allowing the group of contacts to give pressure contact force to the group of terminals in three directions or in four directions, each of the plural group being arranged to generate an opposing force between adjacent groups.

It is preferable that each contact includes a pair of resilient contact pieces at the position bisecting the peripheral surface of each terminal, and the pair of resilient contact pieces are arranged with an orientation of each resilient contact piece changed at an angle of about 90 degrees between adjacent groups.

Alternatively, each contact includes a single resilient contact piece adapted to come in single point contact with the peripheral surface of each terminal, the resilient contact piece being located at the position substantially trisecting or quadsecting the peripheral surface of the terminal between adjacent groups.

With such construction, since an opposing force is generated by resilient contact pieces whose orientation is different for each, positional deviation of the terminals in all directions inclusive of forward/rearward directions as well as leftward/rightward directions can be prevented, and a relative contact position between each contact and each terminal can be properly maintained.

According to the present invention, a problem of positional deviation can effectively be solved, and the tendency toward a very small pitch can advantageously be accommodated by minimizing the number of contact points on a single terminal.

The above and other objects and attendant advantages of the present invention will be apparent to those skilled in the art from a reading of the following description and claims in conjunction with the accompanying drawings which constitute part of this specification.

DESCRIPTION OF THE PREFERRED EMBODIMENTS

Figure 1:
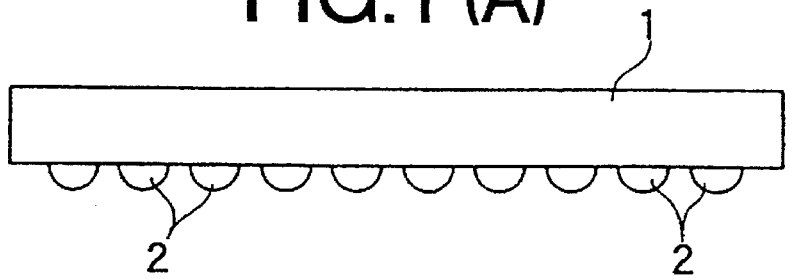
FIG. 1A is a side view of a BGA type IC package including a number of spherical type terminals.
FIG. 1B is a side view of a BGA type IC package including a number of spherical type terminals.
FIG. 1C is a bottom view of the IC package shown in FIG. 1A and FIG. 1B.
Figure 1:
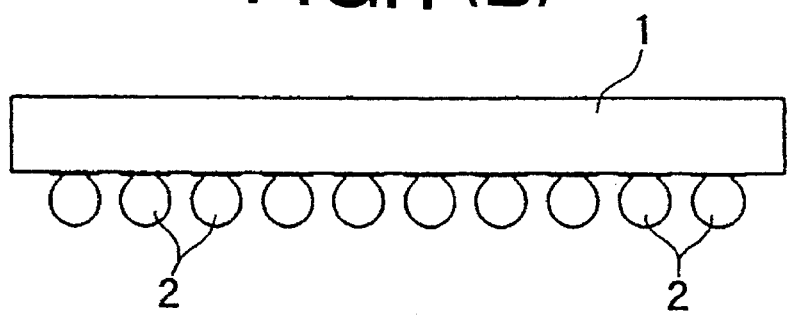
Figure 1:
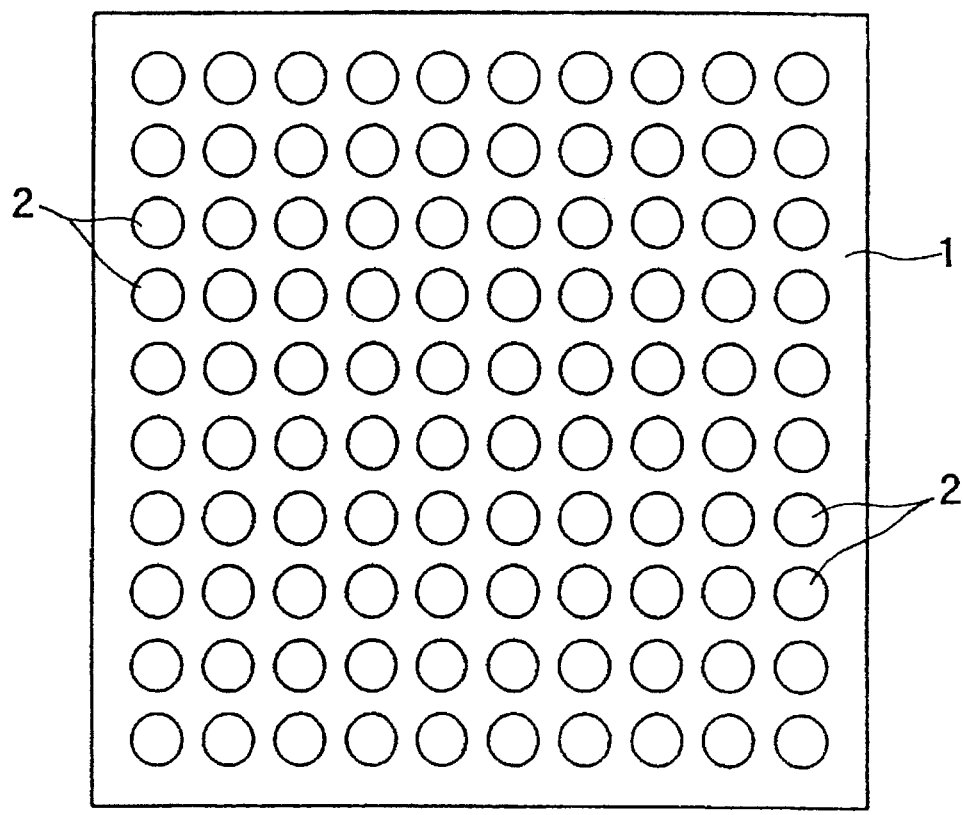
Figure 2:
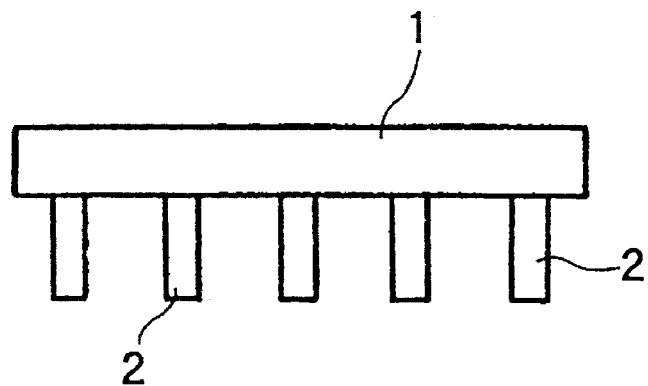
FIG. 2A is a side view of a PGA type IC package including cylindrical terminals.
FIG. 2B is a bottom view of the IC package shown in FIG. 2A.
Figure 2:
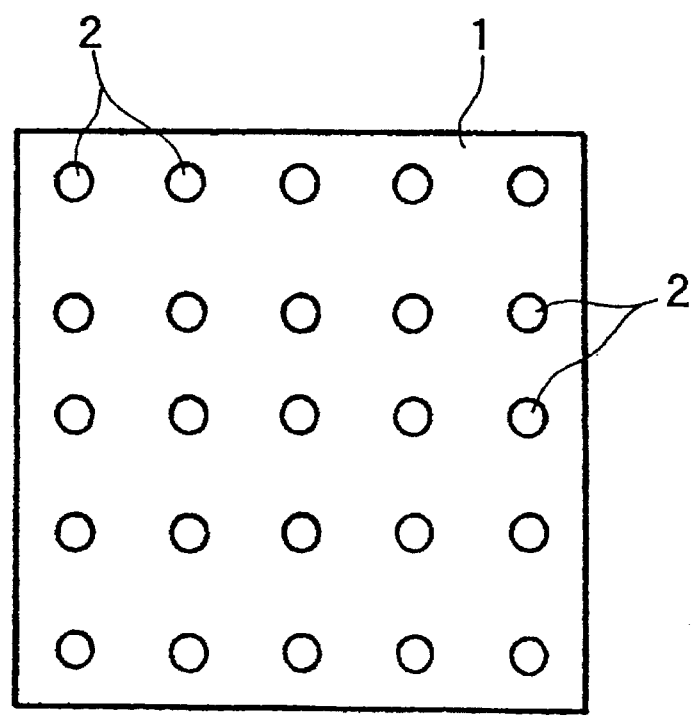

The present invention will now be described in detail hereinafter with reference to the accompanying drawing which illustrate preferred embodiments thereof.

(First Embodiment)

A first embodiment of the present invention will be described below with reference to FIG. 3 to FIG. 5.

In this embodiment, each contact 3 includes a pair of resilient contact pieces 4 disposed opposite to each other to come in pressure contact with the contact 3 at positions substantially bisecting (i.e. at diametrically opposed positions of) the peripheral surface of a spherical type or cylindrical type terminal 2. The contact 3 is located at the position corresponding to each terminal 2 and held in an accommodating hole 6 formed in a socket main body 5. A contact portion 7 of the contact 3 located at the foremost end part of the latter is projected from the upper surface of the socket main body 5 having the accommodating hole 6 formed therein so as to come in pressure contact with the terminal 2.

In the case that an object to come in contact with is a spherical type terminal, the contact portion 7 is formed by slantwise bending the fore part of a pair of resilient contact pieces 4 with an elevation angle of a1 so as to expand the fore end parts of the resilient contact pieces 4. The spherical type terminal 2 is received between the two contact portions 7, and by thrusting the terminal 2 against the inclined surface of the contact portion 7, the resilient contact piece 4 is expanded, such that the contact portions 7 are resiliently spread apart, against the resilient force. Thus, the contact pieces 7 are placed in resilient pressure contact with two diametrically opposite sides of the spherical surface of the terminal without contacting the lower dead point and its surrounding area.

As described above, each contact 3 has a contact structure such that it comes in two point contact with the terminal 2 at the positions bisecting the peripheral surface of the terminal. On the other hand, with respect to a group of contacts, a pair of resilient contact pieces 4 for a plurality of contacts 3a forming one group are located opposite to each other in the forward/rearward directions, while a pair of resilient contact pieces 4 for a plurality of contacts 3b forming another group are located opposite to each other in the leftward/rightward directions. In other words, one group of resilient contact pieces are located with their orientation changed by an angle of about 90 degrees relative to another group of resilient contact pieces.

Figure 3:
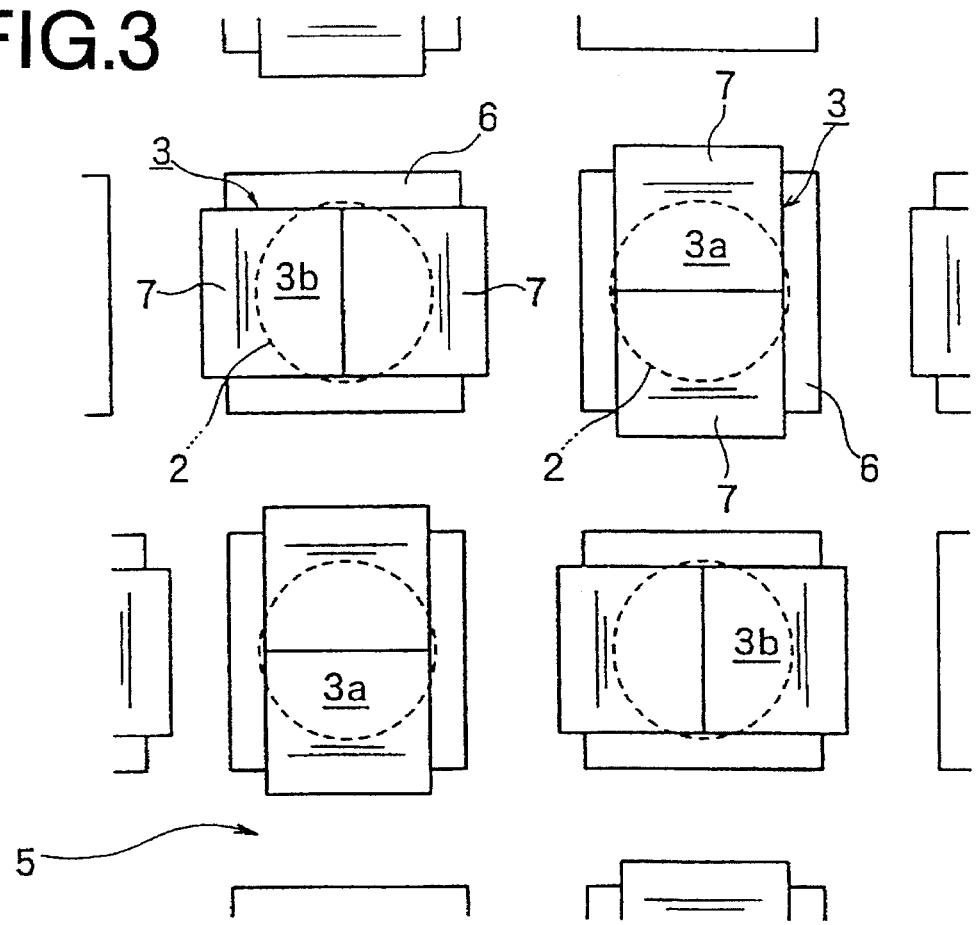
FIG. 3 shows a first embodiment of the present invention, and a plan view which shows by way of example that a contact including a pair of resilient contact pieces comes in pressure contact with a spherical type terminal.
Figure 4:
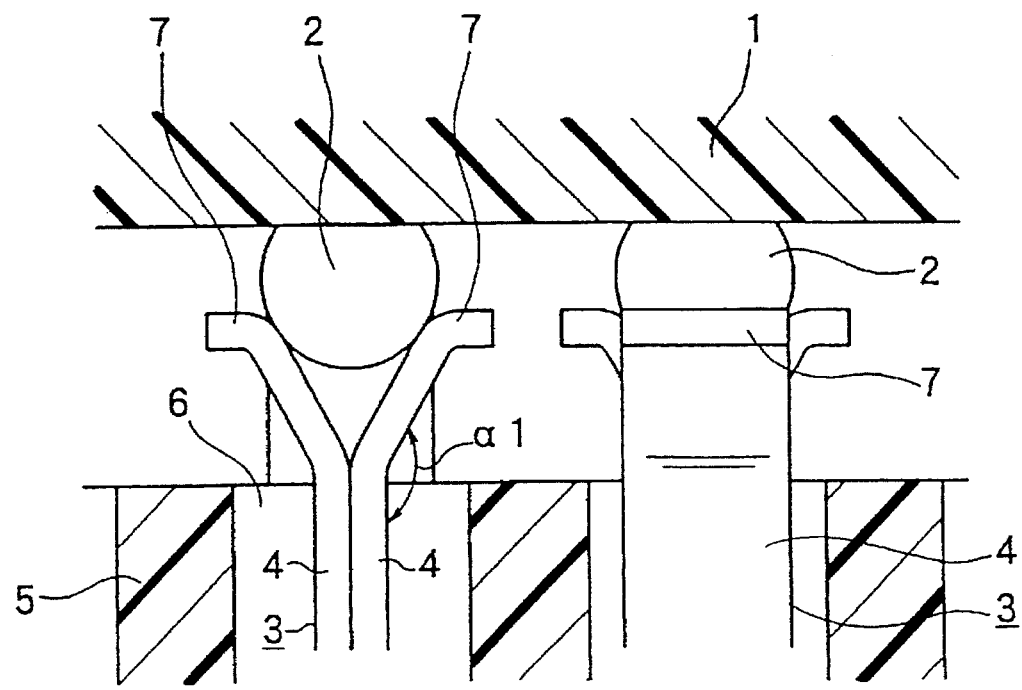
FIG. 4 is a vertical sectional view of the contact structure shown in FIG. 3.
Figure 5:
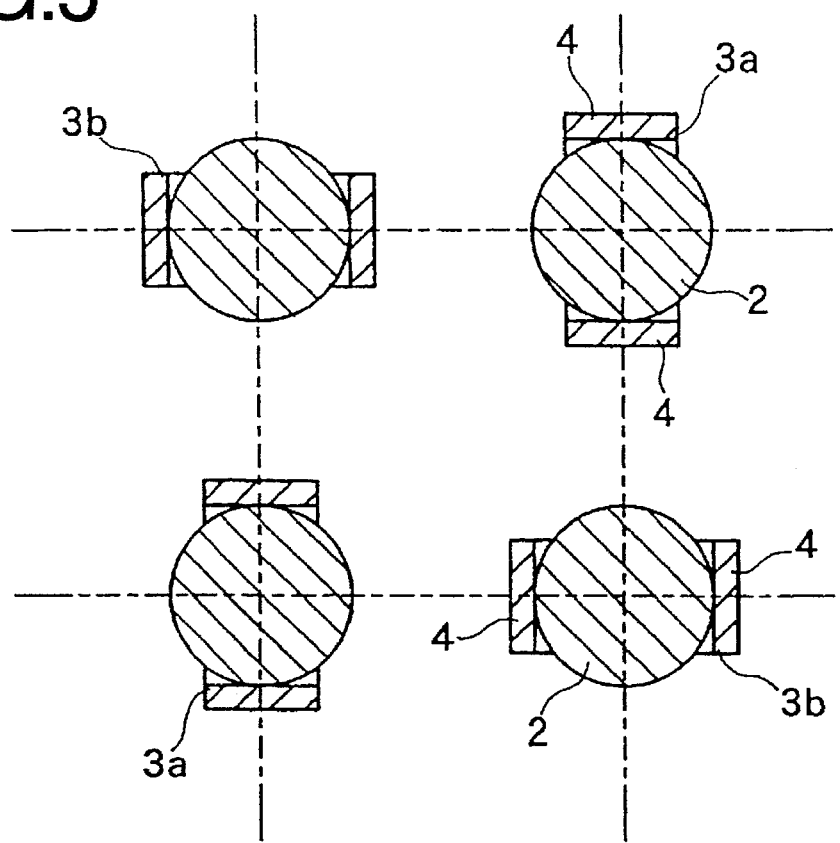
FIG. 5 is a cross-sectional view of the contact structure shown in FIG. 3.

FIG. 3 and FIG. 5 explain the aforementioned arrangement with four terminals and four resilient contact pieces. As shown in FIG. 3 and FIG. 5, when a contact 3a having resilient contact pieces 4 disposed in the forward/rearward directions and a contact 3b having resilient contact pieces 4 disposed in the leftward/rightward directions are arranged to be located adjacent to each other, each contact can advantageously be disposed within a narrow space between two terminals 2.

As described above, movement of the terminals 2 in the forward/rearward directions is restricted by a plurality of contacts 3a forming one group, and similarly, movement of the terminals 2 as seen in the leftward/rightward directions is restricted by a plurality of contacts 3b forming another group, whereby the relative positions of a group of contacts and a group of terminals is properly maintained against movement in all directions.

Also in the case that the terminal 2 is a cylindrical type terminal, two group of contacts are formed so that contacts come in pressure contact with the peripheral surfaces of the terminals in the forward/rearward directions as well as in the leftward/rightward directions while generating the opposing forces.

(Second Embodiment)

A second embodiment of the present invention will be described below with reference to FIG. 6.

In this embodiment, a single contact 3 corresponding to a single terminal 2 is equipped with a pair of resilient contact pieces 4 which are offset from one another by an angle of 90 degrees so that the resilient contact pieces 4 are brought into pressure contact with the terminal 2 from two sides at contacts points offset by an angle of about 90 degrees on the peripheral surface of the terminal 2.

As described above, the contact 3 comes into two point contact with the terminal 2 via a pair of resilient contact pieces at positions offset from one another by an angle of 90 degrees.

Among a group of contacts 3, a pair of resilient contact pieces 4 for contacts 3a forming one group are located opposite to each other on the front side and the left-hand side on the peripheral surface of the terminal 2, while a pair of resilient contact pieces 4 for contacts 3b forming the other group are located opposite to each other on the rear side and the right-hand side on the peripheral surface of the terminal 2.

In other words, the resilient contact pieces belonging to one group are arranged with their orientations changed by an angle of about 180° relative to the resilient contact pieces belonging to the other group.

In this embodiment, arrangement is made such that an angle of a2 defined between a pair of resilient contact pieces 4 of a single contact 3 assumes about 90 degrees. However, the present invention should not be limited only to 90 degrees. Alternatively, the resilient contact pieces 4 may assume, e.g., 60 degrees.

Figure 6:
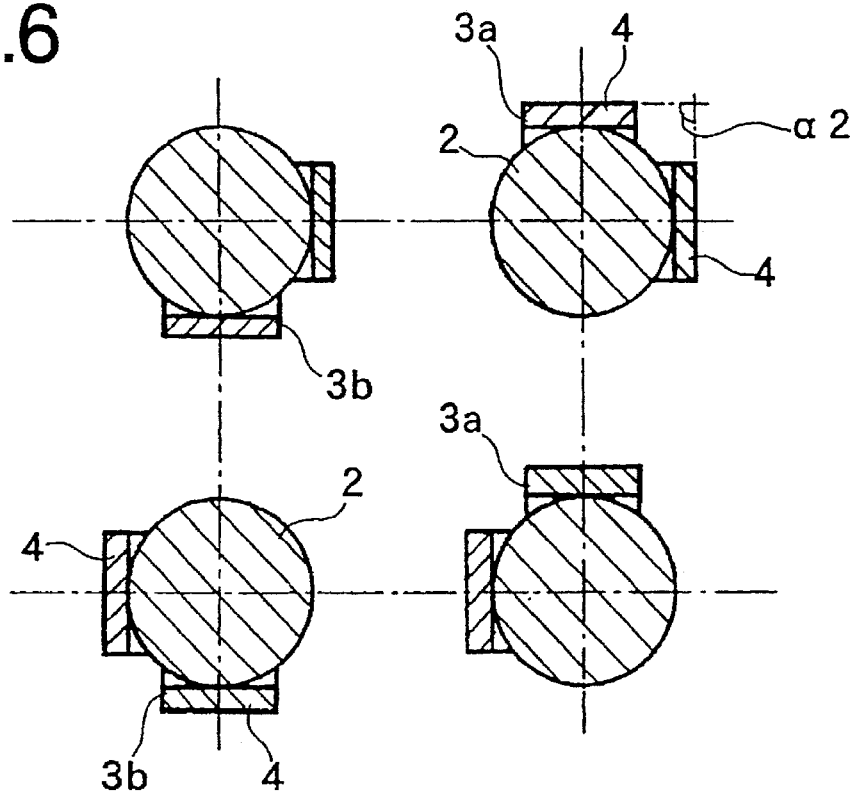
FIG. 6 shows a second embodiment of the present invention, and is a cross-sectional view which shows by way of example that a contact including a pair of resilient contact pieces comes in pressure contact with a spherical type terminal.

As shown in FIG. 6, when a contact 3a belonging to one group has a pair of resilient contact pieces located perpendicular to each other, and a contact 3b belonging to the other group has a pair of resilient contact pieces located perpendicular to each other, are arranged adjacent to each other, each contact can be disposed within a narrow space between the terminals 2.

(Third Embodiment)

A third embodiment of the present invention will be described below with reference to FIG. 7.

Figure 7:
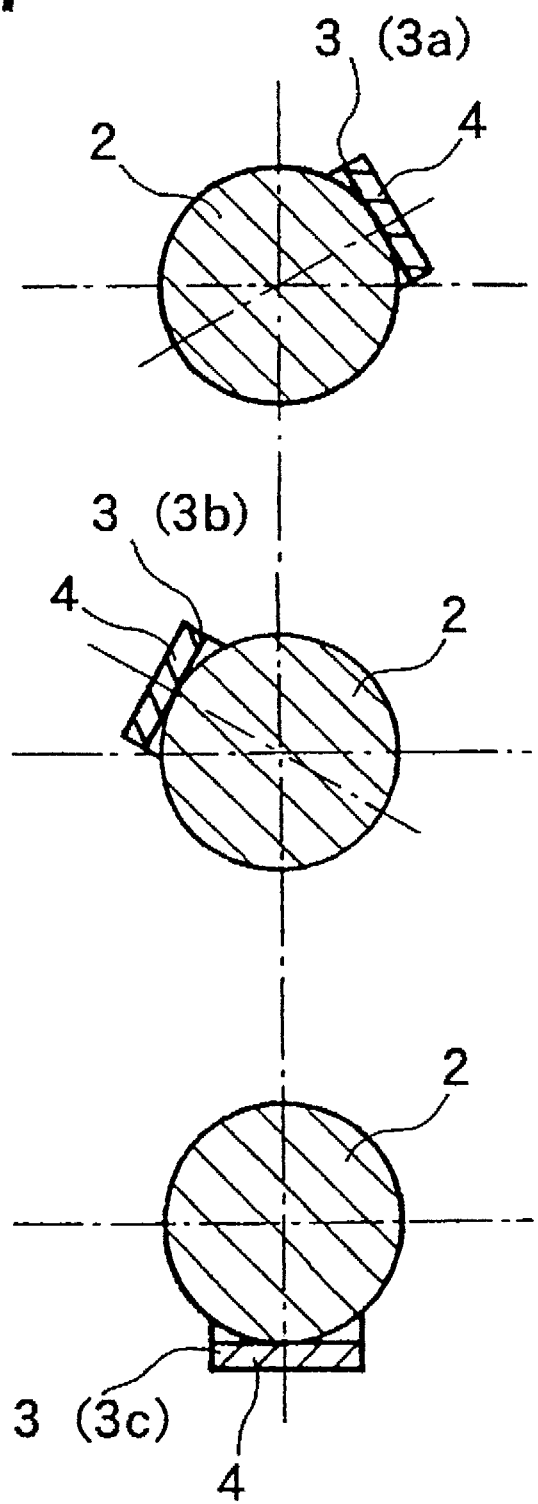
FIG. 7 shows a third embodiment of the present invention, and is a cross-sectional view which shows by way of example that a contact including a single resilient contact piece comes in pressure contact with a spherical type terminal.

FIG. 7 shows an aligning structure in the case that a single resilient contact piece 4 comes in pressure contact with a single terminal 2.

In this embodiment, each contact 3 includes a single resilient contact piece 4 adapted to come in single point contact with a terminal 2 on the peripheral surface. Among a group, the resilient contact pieces 4 are disposed at positions substantially trisecting the foregoing peripheral surfaces (i.e. at position spaced apart by 120°).

Specifically, elastic contact pieces 4 of a first group of plural contacts 3 are brought into pressure contact with respective terminals at first positions trisecting the peripheral surfaces of the terminals 2, elastic contact pieces 4 of a second group of plural contacts 3b are brought into pressure contact with terminals at second positions trisecting the peripheral surface of the terminals 2, and elastic contact pieces 4 of a third group of plural contact 3c are brought into pressure contact with terminals at third positions trisecting the peripheral surface of the terminal 2. In other words, among the three groups, a group of contacts are brought in pressure contact with a group of terminals from three directions which are angular spaced apart by 120°, causing opposing forces to be generated by adjacent groups to exhibit an aligning function.

(Fourth Embodiment)

Figure 8:
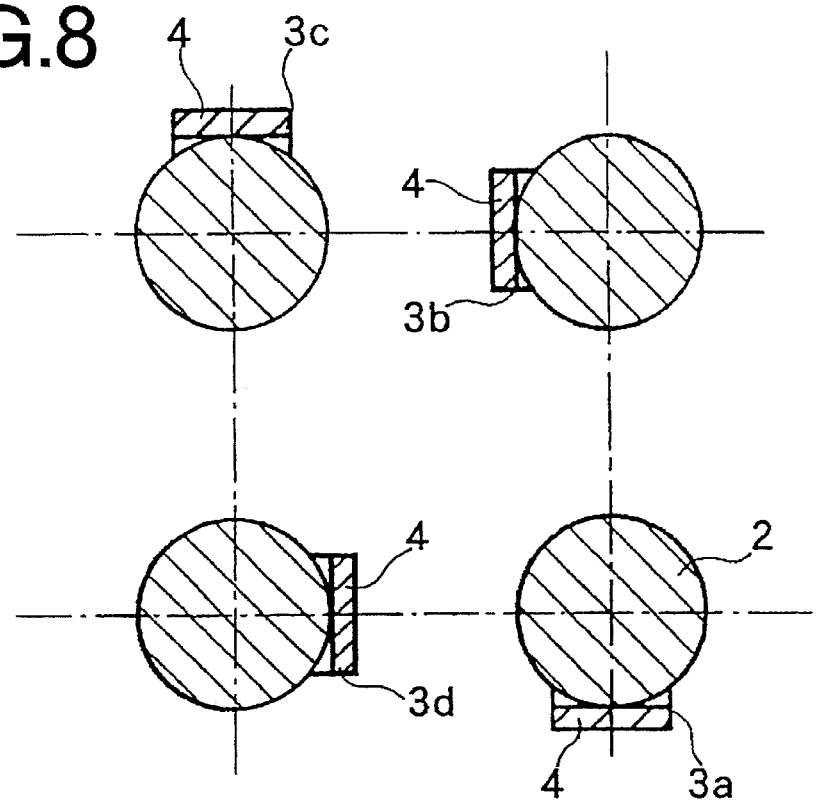
FIG. 8 shows a fourth embodiment of the present invention, and is a cross-sectional view which shows by way of example that a contact including a single resilient contact piece comes in pressure contact with a spherical type terminal.
Figure 9:
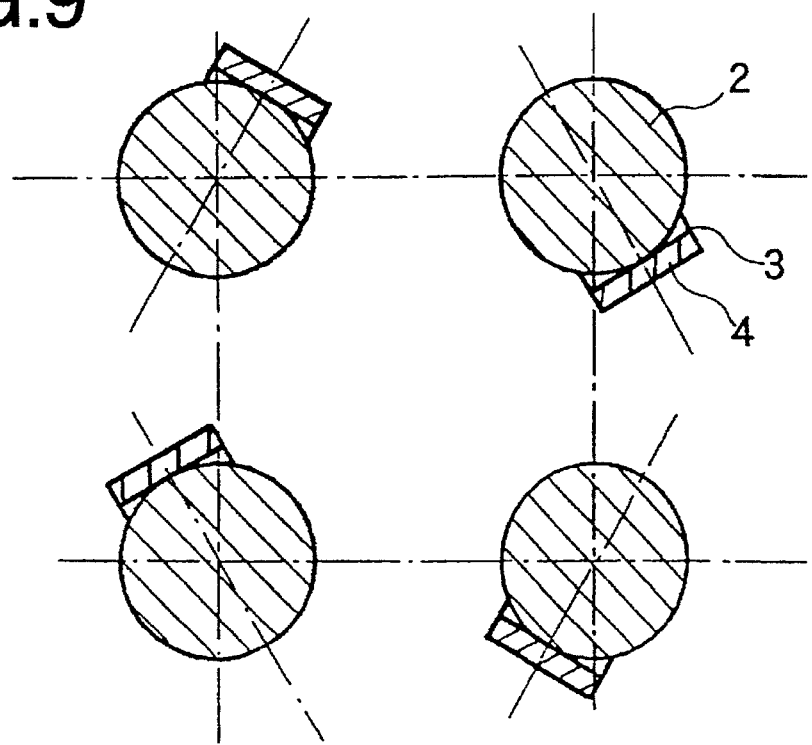
FIG. 9 shows a fifth embodiment of the present invention, and is a cross-sectional view which shows by way of example that a contact including a single resilient contact piece comes in pressure contact with a spherical type terminal.

A fourth embodiment of the present invention will be described below with reference to FIG. 8.

In this embodiment, each contact 3 includes a single resilient contact piece 4 adapted to come in single point contact with a terminal 2 on the peripheral surface of the latter, and the resilient contact pieces 4 are located at positions substantially quadsecting the peripheral surfaces of the terminals, respectively 2 (i.e. for a group of four terminals 2, four contact pieces 4 respectively contact the terminals 2 at four different angular positions of the terminals spaced apart by 90°).

Specifically, for a large number of terminals, resilient contact pieces 4 of a first group of plural contacts 3a are brought into pressure contact with respective terminals 2 from one side (from the front side) at the first position quadsecting the peripheral surfaces of the terminals 2, resilient contact pieces 4 of a second group of plural contacts 3b are brought into pressure contact with respective terminals 2 from one side (from the left-hand side) at the second position quadsecting the peripheral surfaces of the terminals 2, resilient contact pieces 4 of a third group of plural contacts 3c are brought into pressure contact with respective terminals 2 from one side (from the rear side) at the third position quadsecting the peripheral surfaces of the terminals 2, and resilient contact pieces 4 of a fourth group of plural contacts 3d are brought into pressure contact with respective terminals 2 from one side (from the right-hand side) at the fourth position quadsecting the peripheral surfaces of the terminals 2.

In other words, a group of contacts come in pressure contact with a group of terminals from four directions, causing an opposing force to be generated in each group to exhibit an aligning function.

In the third and fourth embodiments, the resilient contact piece of each contact in each group is located at the position trisecting or quadsecting the peripheral surface of the terminal. However, the present invention should not be limited only to this. Alternatively, the resilient contact piece may be located at the position unequally trisecting or quadsecting the peripheral surface of the terminal, causing an opposing force to be generated between adjacent groups to exhibit an aligning function. In this case, the resilient contact pieces belonging to each group are arranged in a well-balanced state while generating the opposing forces among the respective groups.

Although this invention has been described in its preferred form with a certain degree of particularity, it is understood that the present disclosure of the preferred form has been made only by way of example and that numerous changes in the details of construction and arrangement of parts may be resorted to without departing from the spirit and the scope of the invention as hereinafter claimed.

What is claimed is:

1. A contact structure for an IC socket and for use with an IC package having an array of terminals with circular cross-sectional shapes in a predetermined plane, said contact structure comprising:

an array of contacts adapted for alignment with the array of terminals;

wherein each of said contacts includes only one or two discrete contact pieces;

wherein each of said contact pieces is of a configuration for contacting a peripheral surface of one of the terminals by single-point contact;

wherein said one or two contact pieces of each of said contacts are positioned for contacting the respective terminal in such a manner as to prevent substantial movement of that respective terminal in at least one direction but not all directions;

wherein said array of contacts comprises at least a first group of contacts and a second group of contacts, each of said contacts of said first group has its one or two contact pieces arranged for preventing substantial movement in at least a first direction but not in a second direction, and each of said contacts of said second group has its one or two contact pieces arranged for preventing substantial movement in at least said second direction but not in said first direction; and wherein said contacts together constitute a means for preventing substantial movement of the array of terminals in all directions in the predetermined plane.

2. A contact structure as recited in claim 1, wherein each of said contacts includes two discrete contact pieces substantially parallel to and diametrically opposite each other so as to constitute means for preventing substantial movement of the respective terminal in two opposite directions but not in directions perpendicular to said two opposite directions.

3. A contact structure as recited in claim 1, wherein each of said contacts of said first group of contacts has two discrete contact pieces substantially parallel to and diametrically opposite each other; and each of said contacts of said second group of contacts has two discrete contact pieces substantially parallel to and diametrically opposite each other and substantially perpendicular to said contact pieces of each of said contacts of said first group of contacts.

4. A contact structure as recited in claim 1, wherein said array of contacts comprises at least a first group of contacts, a second group of contacts, and a third group of contacts;

each of said contacts of said first group of contacts has two discrete contact pieces substantially perpendicular to each other and positioned for respectively facing one of the terminals along a first contacting direction and a second contacting direction perpendicular to said first contacting direction;

each of said contacts of said second group of contacts has two discrete contact pieces substantially perpendicular to each other and positioned for respectively facing one of the terminals along said second contacting direction and a third contacting direction perpendicular to said second contacting direction and opposite said first contacting direction; and each of said contacts of said third group of contacts has two discrete contact pieces substantially perpendicular to each other and positioned for respectively facing one of the terminals along said third contacting direction and a fourth contacting direction perpendicular to said third contacting direction and opposite said second contacting direction.

5. A contact structure as recited in claim 4, wherein said array of contacts further comprises a fourth group of contacts; and each of said contacts of said fourth group of contacts has two discrete contact pieces substantially perpendicular to each other and positioned for respectively facing one of the terminals along said fourth contacting direction and said first contacting direction.

6. A contact structure as recited in claim 1, wherein said array of contacts comprises at least a first group of contacts, a second group of contacts, and a third group of contacts;

each of said contacts of said first group of contacts has only one contact piece, and said one contact piece is positioned for facing one of the terminals along a first contacting direction;

each of said contacts of said second group of contacts has only one contact piece, and said one contact piece is positioned for facing one of the terminals along a second contacting direction different than said first contacting direction;

each of said contacts of said third group of contacts has only one contact piece, and said one contact piece is positioned for facing one of the terminals along a third contacting direction different than said first and second contacting directions; and one of said contacts of said first group of contacts, one of said contacts of said second group of contacts, and one of said contacts of said third group of contacts together constitute a means for preventing substantial movement of the array of terminals in all directions in the predetermined plane.

7. A contact structure as recited in claim 1, wherein said array of contacts comprises at least a first group of contacts, a second group of contacts, and a third group of contacts;

each of said contacts of said first group of contacts has only one contact piece, and said one contact piece is positioned for facing one of the terminals along a first contacting direction;

each of said contacts of said second group of contacts has only one contact piece, and said one contact piece is positioned for facing one of the terminals along a second contacting direction angularly spaced from said first contacting direction by about 120 degrees;

each of said contacts of said third group of contacts has only one contact piece, and said one contact piece is positioned for facing one of the terminals along a third contacting direction angularly spaced from each of said first and second contacting directions by about 120 degrees; and one of said contacts of said first group of contacts, one of said contacts of said second group of contacts, and one of said contacts of said third group of contacts together constitute a means for preventing substantial movement of the array of terminals in all directions in the predetermined plane.

8. A contact structure as recited in claim 1, wherein said array of contacts comprises a first group of contacts, a second group of contacts, a third group of contacts, and a fourth group of contacts;

each of said contacts of said first group of contacts has only one contact piece, and said one contact piece is positioned for facing one of the terminals along a first contacting direction;

each of said contacts of said second group of contacts has only one contact piece, and said one contact piece is positioned for facing one of the terminals along a second contacting direction different than said first contacting direction;

each of said contacts of said third group of contacts has only one contact piece, and said one contact piece is positioned for facing one of the terminals along a third contacting direction different than said first and second contacting directions;

each of said contacts of said fourth group of contacts has only one contact piece, and said one contact piece is positioned for facing one of the terminals along a fourth contacting direction different than said first, second and third contacting directions; and one of said contacts of said first group of contacts, one of said contacts of said second group of contacts, one of said contacts of said third group of contacts, and one of said contacts of said fourth group of contacts together constitute a means for preventing substantial movement of the array of terminals in all directions in the predetermined plane.

9. A contact structure as recited in claim 1, wherein said array of contacts comprises a first group of contacts, a second group of contacts, a third group of contacts, and a fourth group of contacts;

each of said contacts of said first group of contacts has only one contact piece, and said one contact piece is positioned for facing one of the terminals along a first contacting direction;

each of said contacts of said second group of contacts has only one contact piece, and said one contact piece is positioned for facing one of the terminals along a second contacting direction perpendicular to said first contacting direction;

each of said contacts of said third group of contacts has only one contact piece, and said one contact piece is positioned for facing one of the terminals along a third contacting direction perpendicular to second contacting direction and parallel to said first contacting direction;

each of said contacts of said fourth group of contacts has only one contact piece, and said one contact piece is positioned for facing one of the terminals along a fourth contacting direction perpendicular to said first and third contacting directions and parallel to said second contacting direction; and one of said contacts of said first group of contacts, one of said contacts of said second group of contacts, one of said contacts of said third group of contacts, and one of said contacts of said fourth group of contacts together constitute a means for preventing substantial movement of the array of terminals in all directions in the predetermined plane.

* * * * *